US009897799B2

United States Patent
Wada et al.

(10) Patent No.: US 9,897,799 B2
(45) Date of Patent: Feb. 20, 2018

(54) PIEZOELECTRIC ELEMENT

(71) Applicant: DENSO CORPORATION, Kariya, Aichi-pref. (JP)

(72) Inventors: Akira Wada, Chiryu (JP); Noriyuki Matsushita, Nagoya (JP)

(73) Assignee: DENSO CORPORATION, Kariya (JP)

( * ) Notice: Subject to any disclaimer, the term of this patent is extended or adjusted under 35 U.S.C. 154(b) by 388 days.

(21) Appl. No.: 14/683,199

(22) Filed: Apr. 10, 2015

(65) Prior Publication Data
US 2015/0295159 A1    Oct. 15, 2015

(30) Foreign Application Priority Data

Apr. 15, 2014  (JP) ................................. 2014-083794

(51) Int. Cl.
| | | |
|---|---|---|
| *H01L 41/113* | (2006.01) | |
| *G02B 26/08* | (2006.01) | |
| *H01L 41/053* | (2006.01) | |
| *H01L 41/08* | (2006.01) | |
| *H01L 41/187* | (2006.01) | |
| *H01L 41/09* | (2006.01) | |

(52) U.S. Cl.
CPC ...... *G02B 26/0858* (2013.01); *H01L 41/0533* (2013.01); *H01L 41/0805* (2013.01); *H01L 41/1876* (2013.01); *H01L 41/0933* (2013.01); *H01L 41/0946* (2013.01)

(58) Field of Classification Search
CPC ............... H01L 41/0533; H01L 41/805; H01L 41/1876; H01L 41/0933; H01L 41/0946
See application file for complete search history.

(56) References Cited

U.S. PATENT DOCUMENTS

| | | | |
|---|---|---|---|
| 6,336,717 B1 | 1/2002 | Shimada et al. | |
| 6,502,928 B1 | 1/2003 | Shimada et al. | |
| 7,948,155 B2* | 5/2011 | Hishinuma | .......... B41J 2/14233 310/340 |
| 9,401,471 B2* | 7/2016 | Mizukami | ............ B41J 2/14233 |
| 2007/0247260 A1* | 10/2007 | Yanase | ..................... H03H 3/02 333/187 |
| 2008/0238261 A1* | 10/2008 | Ohashi | ................ H01L 41/0533 310/340 |

(Continued)

FOREIGN PATENT DOCUMENTS

| | | |
|---|---|---|
| JP | 8-264719 A | 10/1996 |
| JP | 11-235818 A | 8/1999 |

(Continued)

*Primary Examiner* — J. San Martin
(74) *Attorney, Agent, or Firm* — Posz Law Group, PLC

(57) ABSTRACT

A piezoelectric element includes a first electrode having a film shape and provided on a base portion, a second electrode having a film shape and opposed to the first electrode on an opposite side of the first electrode from the base portion, a piezoelectric film interposed between the first electrode and the second electrode and partially covered with the second electrode, and an insulation film covering the second electrode and the piezoelectric film with extending over at least a part of an outer edge of the second electrode. The insulation film may cover a whole of the outer edge of the second electrode without covering an inner region of the second electrode. Accordingly, a withstand voltage of the piezoelectric film can be increased.

13 Claims, 3 Drawing Sheets

(56) References Cited

U.S. PATENT DOCUMENTS

2009/0085443 A1    4/2009  Hishinuma et al.
2010/0097431 A1*  4/2010  Takakuwa ............ B41J 2/14233
                                                                      347/68

FOREIGN PATENT DOCUMENTS

| JP | 2001-260357 A | 9/2001 |
|----|---------------|--------|
| JP | 2006-332730 A | 12/2006 |
| JP | 2008-055871 A | 3/2008 |
| JP | 2013-110180 A | 6/2013 |

\* cited by examiner

PIEZOELECTRIC ELEMENT

CROSS REFERENCE TO RELATED APPLICATION

This application is based on and incorporates herein by reference Japanese Patent Application No. 2014-083794 filed on Apr. 15, 2014.

TECHNICAL FIELD

The present disclosure relates to a piezoelectric element.

BACKGROUND

Lead zirconate titanate referred to as PZT is known as a material of a piezoelectric film used for a piezoelectric actuator, for example. PZT is large in piezoelectric constant (i.e. strain per applied voltage) but low in withstand voltage about 10 to 20 V/μm. Thus, insulation breakdown of PZT may occur easily.

Patent Document 1 (JP 2000-326503 A corresponding to U.S. Pat. Nos. 6,502,928 B1, 6,336,717 B1) teaches a piezoelectric element that includes a lower electrode and an upper electrode which are disposed on an insulator layer, and a piezoelectric body layer disposed between these electrodes. A withstand voltage of the piezoelectric body layer is increased by disposing the piezoelectric body layer to cover a lateral surface of the lower electrode.

However, the piezoelectric element of Patent Document 1 may have a part that is deformed due to applied voltage, and a part that is not deformed due to the applied voltage. In a boundary between these areas, a stress may increase and cause cracking. As a result, a leak current may increase, and insulation breakdown of the piezoelectric element may occur.

SUMMARY

It is an objective of the present disclosure to increase a withstand voltage of a piezoelectric film of a piezoelectric element.

According to an aspect of the present disclosure, a piezoelectric element includes a first electrode having a film shape and provided on a base portion, a second electrode having a film shape and positioned on an opposite side of the first electrode from the base portion with being opposed to the first electrode, a piezoelectric film interposed between the first electrode and the second electrode and partially covered with the second electrode, and an insulation film covering the second electrode and the piezoelectric film with extending over at least a part of an outer edge of the second electrode.

In this case, deformation of the piezoelectric film is limited in vicinity of the outer edge of the second electrode, and thus a stress generated inside the piezoelectric film in the deformation can be dispersed over a whole of the piezoelectric element. Therefore, even when a high voltage is applied to the piezoelectric film to be deformed largely, cracks or the like is difficult to be generated in the piezoelectric film. As a result, a withstand voltage of the piezoelectric film in the piezoelectric element can be increased.

The insulation film may cover a whole of the outer edge of the second electrode without covering an inner region of the second electrode.

In this case, the deformation of the piezoelectric film is not prevented within the inner region of the second electrode. Therefore, the piezoelectric element can be deformed appropriately in whole.

BRIEF DESCRIPTION OF THE DRAWINGS

The disclosure, together with additional objectives, features and advantages thereof, will be best understood from the following description, the appended claims and the accompanying drawings, in which:

DETAILED DESCRIPTION

Figure 1:
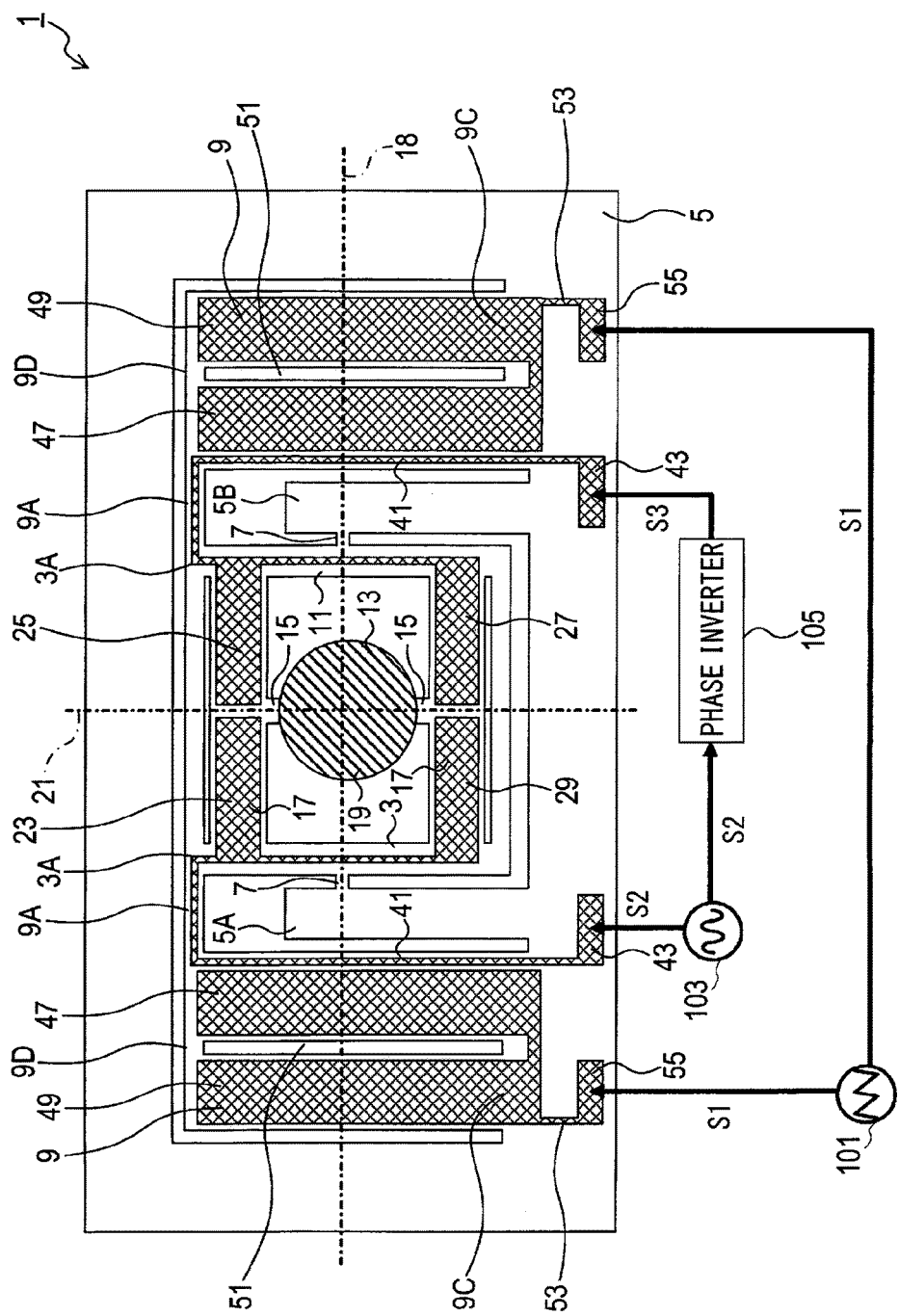
FIG. 1 is a top view showing an optical scanning device according to an exemplar embodiment of the present disclosure.

An exemplar embodiment of the present disclosure will be described with reference to the drawings below. The present disclosure is not limited to the exemplar embodiment described below and may be exploited in a variety of embodiments within a technical scope of the present disclosure.

A configuration of an optical scanning device 1 according to the present embodiment will be described. The optical scanning device 1 includes a reflection portion 3, a support portion 5, a pair of outer joint members 7, and a pair of first drive portions 9, as shown in FIG. 1.

The reflection portion 3 includes an outer circumferential portion 11, an inner circumferential portion 13, a pair of inner joint members 15, and a second drive portion 17. The outer circumferential portion 11 is a rectangular frame, and the inner circumferential portion 13 having a circular plate-like shape is disposed within the frame. The second drive portion 17 is disposed on an upper side and a lower side of the outer circumferential portion 11 in FIG. 1. In other words, the second drive portion 17 is disposed on both sides of the outer circumferential portion 11 in a direction parallel to a plate surface of the inner circumferential portion 13.

The up, down, right and left in the present explanation mean, respectively, the up, down, right and left in FIG. 1 and do not necessarily correspond to the up, down, right and left in use of the optical scanning device 1. Outer edges of the outer circumferential portion 11 in the right-left direction in FIG. 1 are connected to the pair of outer joint members 7. Each outer joint member 7 has a rod-like shape. The pair of outer joint members 7 are arranged on a straight line, referred to as a first axis 18, drawn through a center of the inner circumferential portion 13.

The inner circumferential portion 13 has a reflection surface 19 on which a light beam is reflected, and the reflection surface 19 provided over an entire area of the plate surface of the inner circumferential portion 13. The reflection surface 19 is a thin aluminum film having a thickness of approximately 1.0 μm. Ribs are provided along an edge of the inner circumferential portion 13, and inner sides of the ribs are smaller than the outer circumferential portion 11 in plate thickness.

The pair of inner joint members 15 connects edges of the inner circumferential portion 13 to the outer circumferential portion 11 in an up-down direction in FIG. 1 such that the inner circumferential portion 13 and the outer circumferential portion 11 are capable of oscillating torsionally. Each inner joint member 15 has a rod-like shape. The inner joint members 15 are arranged on a straight line, referred to as a second axis 21, drawn through the center of the inner circumferential portion 13 and perpendicular to the first axis 18.

The second drive portion 17 includes four drive members 23, 25, 27, 29 which are deformable to be curved. The drive members 23, 25, 27, 29 are similar in structure with each other. The drive member 23 connects an upper-left part of the outer circumferential portion 11 to a left side of an upper one of the pair of inner joint members 15. The drive member 25 connects a right-upper part of the outer circumferential portion 11 to a right side of the upper one of the pair of inner joint members 15. The drive member 27 connects a lower-right part of the outer circumferential portion 11 to a right side of a lower one of the pair of inner joint members 15. The drive member 29 connects a lower-left part of the outer circumferential portion 11 to a left side of the lower one of the pair of inner joint members 15.

Each drive member 23, 25, 27, 29 is made of a piezoelectric thin film formed on a plate-like substrate. The piezoelectric thin film has a structure in which an insulation film, an upper electrode, a PZT film and a lower electrode are stacked as described below. PZT represents lead zirconate titanate: $Pb(Zr_xTi_{1-x})O_3$, and the number X in the chemical formula may be equal to 0.52, for example.

The drive members 23, 25, 27, 29 are electrically connected to terminals 43 through wires 41. The terminals 43 are formed on the support portion 5, and the wires 41 stretch to the terminals 43 through connection portions 9A and edge parts on inner sides of the first drive portions 9.

The support portion 5 includes a rectangular frame, and the reflection portion 3 and the pair of first drive portions 9 are disposed within the frame. The support portion 5 includes a pair of protrusion portions 5A and 5B protruding inward from the rectangular frame. The protrusion portions 5A and 5B are disposed, respectively, on one side and the other side of the reflection portion 3 in the right-left direction in FIG. 1. In other words, the reflection portion 3 is positioned between the protrusion portions 5A and 5B in the right-left direction in FIG. 1. Each of the pair of outer joint members 7 has an end connected to the outer circumferential portion 11, and the other opposite end connected to the protrusion portion 5A, 5B. Thus, the protrusion portions 5A, 5B support the reflection portion 3 via the pair of outer joint members 7.

The pair of first drive portions 9 is provided such that one is positioned on a right side of the reflection portion 3 and the other one is positioned on a left side of the reflection portion 3 in FIG. 1. The two first drive portions 9 have similar structures to each other. A lower edge 9C of each first drive portion 9 in FIG. 1 is connected to the support portion 5, and an upper edge 9D of each first drive portion 9 in FIG. 1 is connected to the reflection portion 3. More specifically, each first drive portion 9 includes a connection portion 9A extending to the reflection portion 3 on a side of the upper edge 9D, and an end of the connection portion 9A is connected to an upper edge 3A of the reflection portion 3 in FIG. 1.

Each first drive portion 9 includes two piezoelectric thin films 47, 49 formed on the plate-like substrate. The piezoelectric thin film 49 may be used as an example of a piezoelectric element. The piezoelectric thin films 47, 49 extend from a side of the lower edge 9C to a side of the upper edge 9D in each first drive portion 9. The piezoelectric thin films 47, 49 are similar to the piezoelectric thin films of the drive members 23, 25, 27, 29 in structure. A slit 51 is provided between the piezoelectric thin films 47, 49 and extends in a longitudinal direction thereof. The slit 51 is provided by cutting out a part of the substrate.

Each first drive portion 9 is deformable to be curved according to bending of the piezoelectric thin films 47, 49. A direction of the curvature of the first drive portion 9 is a movement direction of the upper edge 9D coming out of the plane of the paper of FIG. 1.

The piezoelectric thin films 47, 49 are electrically connected to a terminal 55 by a wire 53. The wire 53 and the terminal 55 are formed on the support portion 5.

Figure 2:
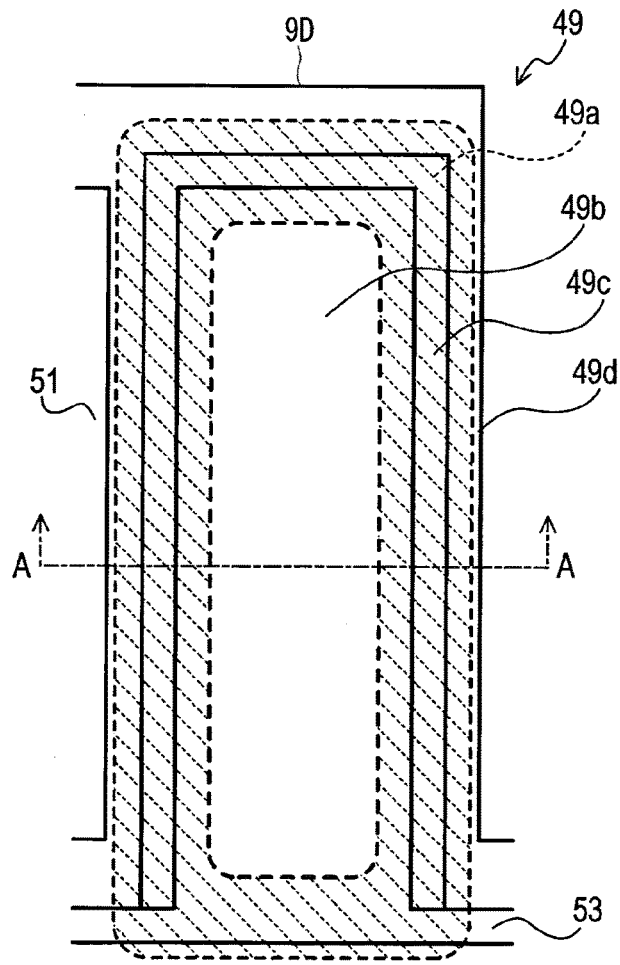
FIG. 2 is a top view showing one of piezoelectric thin films of a first drive portion, according to the exemplar embodiment.
Figure 3:
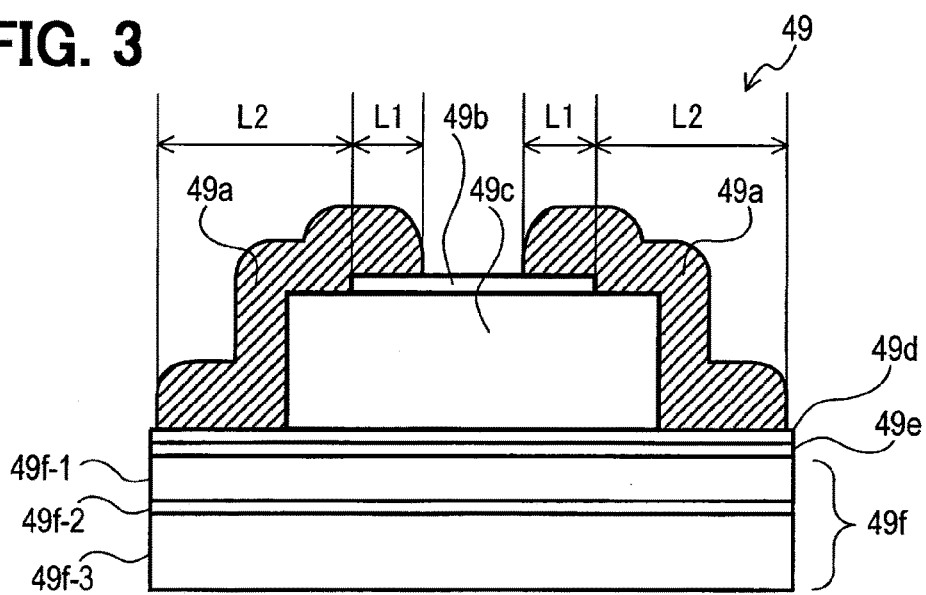
FIG. 3 is a sectional diagram taken along a line A-A of FIG. 2 and showing the piezoelectric thin film when a voltage is not applied to an upper electrode and a lower electrode of the piezoelectric thin film according to the exemplar embodiment.

A configuration of the piezoelectric thin film will be described below. The piezoelectric thin film 49, which is an outer one of the piezoelectric thin films 47, 49 of the first drive portion 9, includes a substrate 49f, a Ti/SiO$_2$ layer 49e, a lower electrode 49d, a PZT film 49c, an upper electrode 49b and an insulation film 49a, which are stacked as shown in FIGS. 2 and 3. The substrate 49f and the Ti/SiO$_2$ layer 49e may be used as examples of a base portion. The lower electrode 49d may be used as an example of a first electrode that has a film shape and is provided on the base portion. The upper electrode 49b may be used as an example of a second electrode that has a film shape and is opposed to the first electrode on an opposite side of the first electrode from the base portion. The PZT film 49c may be used as an example of a piezoelectric film that is interposed between the first electrode and the second electrode and is partially covered with the second electrode.

The substrate 49f is configured as a SOI substrate (i.e. silicon on insulator substrate) and includes a Si support layer 49f-3 having a thickness of 500 μm, an embedded SiO$_2$ 49f-2, having a thickness 1.5 μm, and a Si active layer 49f-1 having a thickness of 100 μm.

Formed on the Si active layer 49f-1 of the substrate 49f is the Ti/SiO$_2$ layer 49e, and stacked on the Ti/SiO$_2$ layer 49e is the lower electrode 49d that is configured to be a Pt layer having a thickness of 0.1 μm.

The PZT film 49c is stacked on the lower electrode 49d and has a thickness of 1.0 μm. The PZT film 49c has an approximately rectangular shape when the PZT film 49c is viewed from above, as shown in FIG. 2. A longitudinal direction of the PZT film 49c coincides with a longitudinal direction of the piezoelectric thin film 49. More specifically, the PZT film 49c is disposed on the lower electrode 49d while the PZT film 49c is separated by a predetermined distance from edge parts of the lower electrode 49d in both the longitudinal direction and a transverse direction along the upper edge 9D. Hence, a step is provided between an upper surface of the lower electrode 49d and an upper surface of the PZT film 49c, as shown in FIG. 3.

Disposed on the PZT film 49c is the upper electrode 49b that is a stacked layer of Au having a thickness of 0.1 μm and Ti having a thickness of 0.03 μm. The upper electrode 49b also has an approximately rectangular shape when the upper electrode 49b is viewed from above, as shown in FIG. 2. The upper electrode 49b is disposed on the PZT film 49c while the upper electrode 49*b* is separated by a predetermined distance from edge parts of the PZT film 49*c* in both the longitudinal direction and the transverse direction along the upper edge 9D. Hence, a step is provided between an upper surface of the upper electrode 49*b* and an upper surface of the PZT film 49*c*, as shown in FIG. 3. A whole of an outer edge of the upper electrode may be positioned on the PZT film 49*c*.

The lower electrode 49*d*, the PZT film 49*c* and the upper electrode 49*b* are connected to the wire 53 that is positioned adjacent to the lower edge 9C. The wire 53 has a similar structure to the piezoelectric thin film 49. In other words, the wire 53 has a structure in which a Ti/SiO$_2$ layer, a lower electrode, a PZT film and an upper electrode are stacked on a substrate. The lower electrode and the upper electrode of the wire 53 are connected to the lower electrode 49*d* and the upper electrode 49*b* of the piezoelectric thin film 49, respectively.

The insulation film 49*a* made of SiO$_2$ covers the upper electrode 49*b*, the PZT film 49*c* and the lower electrode 49*d*. More specifically, the insulation film 49*a* covers the outer edge of the upper electrode 49*b* (i.e. a boundary between the upper electrode 49*b* and the PZT film 49*c*) and a region along the outer edge on the upper surface of the upper electrode 49*b*. A center part of the upper surface of the upper electrode 49*b*, i.e. a region away from the outer edge by a predetermined distance is an open region (inner region) that is not covered by the insulation film 49*a*. The insulation film 49*a* may be in direct contact with the outer edge of the upper electrode 49*b* and the PZT film 49*c*.

The insulation film 49*a* further covers an outer edge of the PZT film 49*c* (i.e. a boundary between the lower electrode 49*d* and the PZT film 49*c*), a lateral surface (edge surface) of the PZT film and the upper surface of the PZT film 49*c* other than a region covered by the upper electrode 49*b*.

The insulation film 49*a* further covers an upper surface (upper electrode) of a connection part between the wire 53 and the piezoelectric thin film 49. The piezoelectric thin film 47 has a similar configuration to that of the above-described piezoelectric thin film 49. Also, the piezoelectric thin films of the drive members 23, 25, 27, 29 have similar configurations to that of the above-described piezoelectric thin film 49. The wire 41 also has a similar configuration to that of the wire 53.

A manufacturing method of the optical scanning device 1 will be described below. The optical scanning device 1 can be manufactured by below methods. Firstly, an SOI substrate is prepared. The SOI substrate has a structure in that a Si support layer having a thickness of 500 μm, an embedded SiO$_2$ having a thickness of 1.5 μm, and a Si active layer having a thickness of 100 μm are stacked.

The reflection surface 19, the piezoelectric thin films of the drive members 23, 25, 27, 29, the piezoelectric thin films 47, 49 of the pair of first drive portions 9, the wires 41, 53, and the terminals 43, 55 are provided on a surface of the substrate by film formation.

More specifically, the piezoelectric thin film is formed as below. A natural oxidation film on the substrate is removed, and a layer of SiO$_2$ having a thickness of 1.0 μm is formed on the substrate by thermal oxidation. Subsequently, a cohesive layer of Ti having a thickness of 0.2 μm is formed on the layer of SiO$_2$ by sputtering. Accordingly, a Ti/SiO$_2$ layer is formed.

Next, a Pt layer having a thickness of 0.1 μm is formed as the lower electrode at 500° C. by sputtering, and a PZT film having a thickness of 1.0 μm is formed on the lower electrode at 600° C. by sputtering. The material or state of the Ti/SiO$_2$ layer 49*e* (base layer) may be changed, and a layer of single-crystal PZT may be formed via epitaxial growth.

The PZT film is made of PZT, but may be made of a material including PZT or a material derived from PZT. Even in this case, single-crystal PZT obtained via epitaxial growth may be used. Alternatively, another piezoelectric element may be used for a part corresponding to the PZT film.

An upper electrode made of Au/Ti (0.1 μm/0.03 μm in thickness) is formed on the PZT film by vapor deposition. Next, patterning of the upper electrode (Au/Ti) is performed by lithography. At this time, Au is processed by wet etching with a mixed liquid of iodine and ammonium iodide, and Ti is processed by wet etching with ammonia hydrogen peroxide-water mixture. Subsequently, the PZT film is processed by wet etching with hydrofluoric-nitric acid solution.

Next, an insulation layer (SiO$_2$) is formed by plasma-enhanced chemical vapor deposition such that the insulation layer has a thickness of 0.9 μm and covers the upper electrode, an entire area of the PZT film and the lower electrode. After this, a part of the insulation layer is removed by wet etching with fluorine such that the upper electrode has an open region (inner region) that is not covered by the insulation layer.

Other than SiO$_2$, for example, SiN, SiON, Al$_2$O$_3$ or polyimide may be used for the insulation layer. Alternatively, the insulation layer may be made of a material containing SiO$_2$, SiN, SiON, Al$_2$O$_3$ or polyimide.

Finally, the SOI substrate is etched such that an integrated member is formed. The integrated member includes the support portion 5 (having the protrusion portions 5A, 5B), the outer joint members 7, an arrangement region of the first drive portions 9, the connection portion 9A, the outer circumferential portion 11, the inner joint members 15 and the inner circumferential portion 13 (other than the reflection surface 19).

The above-described manufacturing method is just an example. The optical scanning device 1 can be manufactured by other various methods.

With reference to FIG. 1, operations of the optical scanning device 1 will be described. The pair of terminals 55 is connected to a first drive-signal source 101 and receives drive signals S1 having frequency of 60 Hz. The drive signal S1 causes the piezoelectric thin films 47, 49 of each first drive portion 9 to curve so that the connection portion 9A moves in the direction coming out of the plane of the paper of FIG. 1. Since the upper edge 3A of the reflection portion 3 is connected to the connection portions 9A of the pair of first drive portions 9, the upper edge 3A of the reflection portion 3 moves in the direction coming out of the plane of the paper of FIG. 1 due to the curving of the first drive portions 9.

As a result, the reflection portion 3 oscillates torsionally with the outer joint members 7 (i.e. first axis 18) being used as a center axis. The torsional oscillation of the reflection portion 3 is non-resonance oscillation.

One of the pair of terminals 43 is connected directly to a second drive-signal source 103, and the other of the pair of terminals 43 is connected to the second drive-signal source 103 via a phase inverter circuit 105. Accordingly, the one of the pair of terminals 43 receives a drive signal S2 having frequency of 30 kHz, and the other of the pair of terminals 43 receives a drive signal S3 that is opposite in phase to the drive signal S2.

In accordance with the drive signals S2 and S3, the second drive portion 17 is alternately changed into a state, in which centers of the drive members 23 and 29 in the right-left direction in FIG. 1 are moved upward while centers of the drive members 25 and 27 in the right-left direction in FIG. 1 are moved downward, and a state, in which the centers of the drive members 23 and 29 in the right-left direction in FIG. 1 are moved downward while the centers of the drive members 25 and 27 in the right-left direction in FIG. 1 are moved upward. Accordingly, the inner circumferential portion 13 oscillates torsionally with the inner joint members 15 (i.e. second axis 21) being used as a center axis. The torsional oscillation of the inner circumferential portion 13 is resonance oscillation.

Therefore, the reflection surface 19 provided on the inner circumferential portion 13 of the reflection portion 3 is capable of oscillating with respect to the first axis 18 and the second axis 21, and a light reflected from the reflection surface 19 can be controlled in two dimensions for scanning.

Experiments and results will be described below. As shown in FIGS. 2 and 3, an edge part of the insulation film 49a, which is positioned on an upper part of the upper electrode 49b and is used as a boundary with the open region of the upper electrode 49b, is defined as an inner edge part. Another edge part of the insulation film 49a, which is positioned on an upper part of the lower electrode 49d and extends along an outer circumference of the lower electrode 49d, is defined as an outer edge part.

As shown in FIG. 3, in the piezoelectric thin film 49, a distance between an outer edge of the upper electrode 49b and the inner edge part in a horizontal direction (i.e. a direction along an upper surface of the PZT film 49c) is defined as a distance L1. A distance between the outer edge of the upper electrode 49b and the outer edge part in the horizontal direction is defined as a distance L2.

Changes in withstand voltage of the insulation film 49a depending on the distances L1 and L2 or a thickness of the insulation film 49a are measured in experiments. Table 1 shows measurement results of a withstand voltage ratio of the insulation film 49a in accordance with change in the distance L1. In this case, the withstand voltage ratio is a ratio of a measurement value of the withstand voltage to a withstand voltage that is measured when the distance L1 is 0 μm, i.e. when the insulation film 49a is not present. The measurement results shown in Table 1 are obtained when the distance L2 is 3.0 μm and when the thickness of the insulation film 49a is 3.0 μm.

TABLE 1

| Distance L1 (μm) | Withstand Voltage Ratio |
| --- | --- |
| 0 | 1.0 |
| 0.5 | 1.09 |
| 1.0 | 1.2 |
| 2.0 | 1.27 |
| 3.0 | 1.52 |
| 30.0 | 1.52 |

Table 2 shows measurement results of a withstand voltage ratio of the insulation film 49a in accordance with change in the distance L2. In this case, the withstand voltage ratio is a ratio of a measurement value of the withstand voltage to a withstand voltage that is measured when the distance L2 is 0 μm, i.e. when the insulation film 49a is not present. The measurement results shown in Table 2 are obtained when the distance L1 is 3.0 μm and when the thickness of the insulation film 49a is 3.0 μm.

TABLE 2

| Distance L2 (μm) | Withstand Voltage Ratio |
| --- | --- |
| 0 | 1.0 |
| 0.5 | 1.07 |
| 1.0 | 1.12 |
| 2.0 | 1.26 |
| 3.0 | 1.52 |
| 30.0 | 1.49 |

Table 3 shows measurement results of a withstand voltage ratio of the insulation film 49a in accordance with change in the thickness of the insulation film 49a. In this case, the withstand voltage ratio is a ratio of a measurement value of the withstand voltage to a withstand voltage that is measured when the thickness is 0 μm, i.e. when the insulation film 49a is not present. The measurement results shown in Table 3 are obtained when both distances L1 and L2 are 3.0 μm.

TABLE 3

| Thickness (μm) | Withstand Voltage Ratio |
| --- | --- |
| 0 | 1.0 |
| 0.1 | 1.16 |
| 0.5 | 1.4 |
| 0.9 | 1.46 |
| 2.0 | 1.5 |
| 3.0 | 1.52 |

According to the experimental results, it is found that the withstand voltage is increased when the distance L1 is longer than or equal to 0.5 μm, and the withstand voltage is further increased when the distance L1 is longer than or equal to 3.0 μm.

It is found that the withstand voltage is increased when the distance L2 is longer than or equal to 0.5 μm, and the withstand voltage is further increased when the distance L2 is longer than or equal to 3.0 μm.

It is found that the withstand voltage is increased when the thickness of the insulation film 49a is longer than or equal to 0.1 μm, and the withstand voltage is further increased when the thickness is from 0.5 μm to 3.0 μm.

Hence, the distance L1 may be set longer than or equal to 0.5 μm, or may be set longer than or equal to 3.0 μm, alternatively. The distance L2 may be longer than or equal to 0.5 μm, or may be set longer than or equal to 3.0 μm, alternatively. The thickness of the insulation film 49a may be set longer than or equal to 0.1 μm, or may be set from 0.5 μm to 3.0 μm, alternatively.

Figure 4:
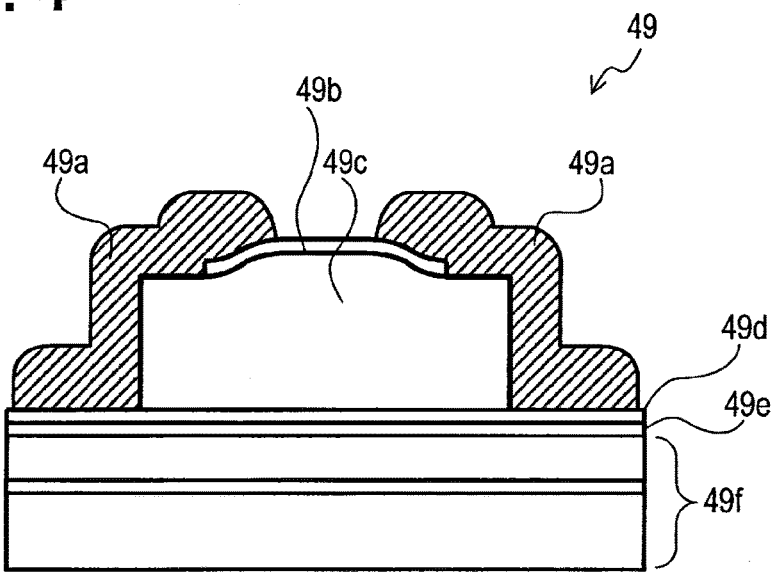
FIG. 4 is a sectional diagram taken along a line A-A of FIG. 2 and showing the piezoelectric thin film when a voltage is applied to an upper electrode and a lower electrode of the piezoelectric thin film according to the exemplar embodiment.

Effects of the present will be described below. When a voltage is applied to both the upper electrode 49b and the lower electrode 49d, a part of the PZT film 49c under the upper electrode 49b is curved so as to expand upward, i.e. lift up the upper electrode 49b, as shown in FIG. 4.

In the piezoelectric thin film 49 of the present embodiment, since an outer edge of the upper electrode 49b (i.e. a boundary between the upper electrode 49b and the upper surface of the PZT film 49c) and the surroundings thereof are covered by the insulation film 49a, deformation of a part of the PZT film 49c adjacent to the outer edge of the upper electrode 49b is limited. Thus, when a voltage is applied to the PZT film 49c, the PZT film 49c is curved to lift up a center part of the upper electrode 49b, as shown in FIG. 4. Accordingly, stress generated inside the PZT film 49c can be distributed over the whole of the piezoelectric thin film 49 when the PZT film 49c is deformed.

Even when a high voltage is applied to the PZT film 49c so as to largely deform the PZT film 49c, cracks are difficult to be generated in the PZT film 49c, and the withstand voltage increases. In the piezoelectric thin film 49 of the present embodiment, the center part of the upper surface of the upper electrode 49b is not covered by the insulation film 49a. Accordingly, deformation of the PZT film 49c is not prevented under the center part of the upper electrode 49b, and thus the whole of the piezoelectric thin film 49 can be deformed appropriately.

When single-crystal PZT produced via epitaxial growth is used for the PZT film 49c, the withstand voltage is higher in the single-crystal PZT film than in a polycrystalline PZT film. Thus, a stress generated around the outer edge of the upper electrode 49b in deformation becomes high and may cause insulation breakdown that begins at the outer edge. According to the present embodiment, however, the insulation film 49a is provided as described above such that the withstand voltage of the PZT film 49c increases, and the insulation breakdown can be limited.

In the present embodiment, the insulation film 49a of the piezoelectric thin film 49 covers the whole of the outer edge of the upper electrode 49b. However, the insulation film 49a may cover a part of the outer edge.

In the present embodiment, the insulation film 49a is disposed to provide the single open region on the upper electrode 49b. However, the insulation film 49a may be disposed such that the upper electrode 49b has multiple open regions.

Also in such a case, the distance between the outer edge of the upper electrode 49b and an inner edge part that defines each open region in the horizontal direction may be longer than or equal to 3.0 μm, or longer than or equal to 0.5 μm.

The insulation film 49a may cover the whole of the upper electrode 49b. When the insulation film 49a covers the whole of the upper electrode 49b, a thickness of a part of the insulation film 49a positioned on a center part (a region separated by a predetermined distance from the outer edge) of the upper electrode 49b may be made to be thinner than the other parts.

Even in such a case, effects similar to the above can be obtained.

In the present embodiment, the insulation film 49a of the piezoelectric thin film 49 is disposed such that the whole of the outer edge part extends to the lower electrode 49d.

Figure 5:
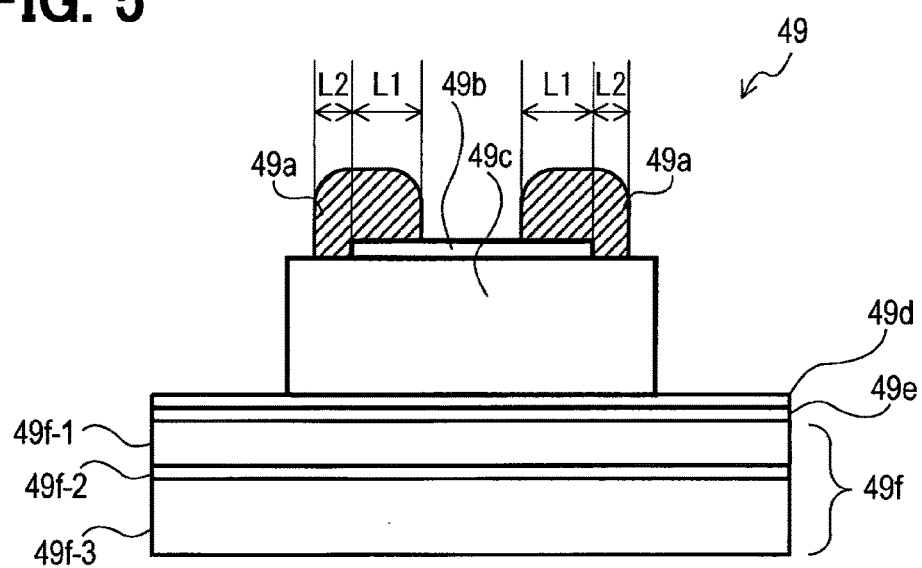
FIG. 5 is a sectional diagram showing a piezoelectric thin film according to a modification of the present disclosure.

However, a whole of the outer edge part of the insulation film 49a may extend and be positioned on the upper surface of the PZT film 49c as shown in FIG. 5. Further, also in this case, similar to the present embodiment, the distance L2 between the outer edge of the upper electrode 49b and the outer edge part in the horizontal direction may be longer than or equal to 3.0 μm, or longer than or equal to 0.5 μm.

The outer edge part of insulation film 49a may be positioned on lateral surfaces and the upper surfaces of the lower electrode 49d and the PZT film 49c, or may be positioned on a lateral surface or the upper surface of the PZT film 49c.

Even in this case, effects similar to the above can be obtained.

In the present embodiment, the upper electrode 49b is disposed on the center part of the upper surface of the PZT film 49c, and the PZT film 49c is disposed on the center part of the lower electrode 49d.

Without limiting thereto, however, the upper electrode 49b may be disposed such that a part of the outer edge of the upper electrode 49b is in contact with an edge part of the upper surface of the PZT film 49c. The PZT film 49c may be disposed such that the whole or a part of the outer edge of the PZT film 49c is in contact with an edge part of the lower electrode 49d.

Even in this case, effects similar to the above can be obtained.

The piezoelectric thin film 49 of the present embodiment is used as a piezoelectric actuator of the optical scanning device 1. Without limiting thereto, for example, the piezoelectric thin film 49 may be used as a piezoelectric actuator used in an inkjet recording head or the like. Even in this case, effects similar to the above can be obtained.

Additional advantages and modifications will readily occur to those skilled in the art. The disclosure in its broader terms is therefore not limited to the specific details, representative apparatus, and illustrative examples shown and described.

What is claimed is:

1. A piezoelectric element comprising:
a first electrode having a film shape and provided on a base portion;
a second electrode having a film shape and positioned on an opposite side of the first electrode from the base portion with being opposed to the first electrode;
a piezoelectric film interposed between the first electrode and the second electrode, the piezoelectric film being partially covered with the second electrode; and
an insulation film covering the second electrode and the piezoelectric film with extending over at least a part of an outer edge of the second electrode,
wherein
the insulation film covers a whole of the outer edge of the second electrode without covering an inner region of the second electrode,
an edge part of the insulation film, which is a boundary with the inner region, is defined as an inner edge part, and
a distance between the outer edge of the second electrode and the inner edge part is longer than or equal to 0.5 μm.

2. The piezoelectric element according to claim 1, wherein the distance between the outer edge of the second electrode and the inner edge part is longer than or equal to 3.0 μm.

3. The piezoelectric element according to claim 1, wherein the insulation film covers, at least, a part of a lateral surface of the piezoelectric film or both a part of the lateral surface of the piezoelectric film and a part of the base portion.

4. The piezoelectric element according to claim 1, wherein the insulation film has a thickness larger than or equal to 0.1 μm.

5. The piezoelectric element according to claim 1, wherein the insulation film has a thickness from 0.5 μm to 3.0 μm.

6. The piezoelectric element according to claim 1, wherein the insulation film is made of any one of $SiO_2$, SiN, SiON, $Al_2O_3$ or polyimide, or made of a material containing any one of $SiO_2$, SiN, SiON, $Al_2O_3$ or polyimide.

7. The piezoelectric element according to claim 1, wherein the piezoelectric film is made of $Pb(Zr_xTi_{1-x})O_3$ or a material containing $Pb(Zr_xTi_{1-x})O_3$.

8. The piezoelectric element according to claim 7, wherein the $Pb(Zr_xTi_{1-x})O_3$ of the piezoelectric film is a single crystal.

9. The piezoelectric element according to claim 1, wherein a whole of the outer edge of the second electrode is positioned on the piezoelectric film.

10. The piezoelectric element according to claim 1, wherein the insulation film is in direct contact with the outer edge of the second electrode and the piezoelectric film.

11. The piezoelectric element according to claim 1, wherein the inner region of the second electrode is exposed to an air.

12. A piezoelectric element comprising:
- a first electrode having a film shape and provided on a base portion;
- a second electrode having a film shape and positioned on an opposite side of the first electrode from the base portion with being opposed to the first electrode;
- a piezoelectric film interposed between the first electrode and the second electrode, the piezoelectric film being partially covered with the second electrode; and
- an insulation film covering the second electrode and the piezoelectric film with extending over at least a part of an outer edge of the second electrode, wherein the insulation film covers a whole of the outer edge of the second electrode without covering an inner region of the second electrode, an edge part of the insulation film on an outer circumference thereof is defined as an outer edge part, and a distance between the outer edge of the second electrode and the outer edge part is longer than or equal to 0.5 μm.

13. The piezoelectric element according to claim 12, wherein the distance between the outer edge of the second electrode and the outer edge part is longer than or equal to 3.0 μm.

* * * * *